United States Patent
Iwanaga et al.

(10) Patent No.: US 6,710,380 B2
(45) Date of Patent: Mar. 23, 2004

(54) DIODE, METHOD FOR FABRICATING THE DIODE, AND COPLANAR WAVEGUIDE

(75) Inventors: Junko Iwanaga, Shijonawate (JP); Yorito Ota, Kobe (JP); Mitsuru Tanabe, Katano (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/147,806

(22) Filed: May 20, 2002

(65) Prior Publication Data

US 2002/0155643 A1 Oct. 24, 2002

Related U.S. Application Data

(62) Division of application No. 09/686,909, filed on Oct. 12, 2000, now Pat. No. 6,417,527.

(30) Foreign Application Priority Data

Oct. 12, 1999 (JP) ............................................. 11-289565

(51) Int. Cl.[7] ............................................. H01L 31/109
(52) U.S. Cl. ............................. 257/199; 257/79; 257/80
(58) Field of Search ............................. 257/199, 79, 80

(56) References Cited

U.S. PATENT DOCUMENTS

| | | | | |
|---|---|---|---|---|
| 3,786,320 A | * | 1/1974 | Kano et al. ................. 257/418 |
| 4,369,565 A | * | 1/1983 | Muramatsu ................. 438/430 |
| 4,590,664 A | * | 5/1986 | Prentice et al. ............. 438/328 |
| 4,683,483 A | * | 7/1987 | Burnham et al. ........... 257/551 |
| 4,821,093 A | | 4/1989 | Iafrate et al. |
| 4,829,346 A | | 5/1989 | Kasahara et al. |
| H665 H | | 8/1989 | Knolle et al. |
| 5,949,096 A | | 9/1999 | Ohkubo et al. |
| 5,986,326 A | | 11/1999 | Kato |
| 6,103,564 A | * | 8/2000 | Masuda ....................... 438/237 |
| 6,133,621 A | * | 10/2000 | Gaibotti et al. ............. 257/659 |
| 6,365,951 B1 | * | 4/2002 | Worley ........................ 257/438 |
| 6,469,319 B1 | * | 10/2002 | Su et al. ........................ 257/78 |

OTHER PUBLICATIONS

M. Reddy et al., "Fabrication and dc, microwave characteristics of submicron Shottky–collector AlAs/In$_{0.53}$Ga$_{0.47}$As/ InP resonant tunneling diodes", J. Appl. Phys. 77 (9) May 1, 1995, pp. 4819–4821.

* cited by examiner

*Primary Examiner*—Wael Fahmy
*Assistant Examiner*—Nathan W. Ha
(74) *Attorney, Agent, or Firm*—Nixon Peabody LLP; Donald R. Studebaker

(57) ABSTRACT

The diode of the present invention includes: a cathode electrode and an anode electrode that are disposed on a semiconductor substrate and are spaced apart from each other; and a shielding metal member placed between the cathode and anode electrodes.

3 Claims, 8 Drawing Sheets

DIODE, METHOD FOR FABRICATING THE DIODE, AND COPLANAR WAVEGUIDE

BACKGROUND OF THE INVENTION

The present invention generally relates to a diode, a method for fabricating the diode and a coplanar waveguide, and more particularly relates to a diode that should have an increased isolation.

A large-capacity, high-speed communications system, utilizing the millimeter-wave band (i.e., between 27 GHz and 32 GHz) as its frequency resource, is one of the potential next-generation communications systems. In the field of communications systems, an RF switch with high isolation, which is applicable to switching the modes of operation from transmission into reception, and vice versa, is in high demand. A PIN diode mainly composed of GaAs is one of the candidates for the RF switch. In the current state of the art, a PIN diode switch is normally implemented as a vertical PIN diode. However, a PIN diode switch is also implementable as a horizontal PIN diode. A horizontal PIN diode can be fabricated by an ion implantation process. Accordingly, compared to the vertical PIN diode, the production cost can be cut down by using the horizontal PIN diode and those horizontal PIN diodes can be integrated together much more easily.

FIG. 8 illustrates a cross-sectional structure of a known horizontal PIN diode. As shown in FIG. 8, the horizontal PIN diode includes n- and p-type semiconductor regions 102 and 103 that are defined in a semiconductor substrate 101 of GaAs. An n-side ohmic electrode 104 is formed on, and makes an ohmic contact with, the n-type semiconductor region 102, while a p-side ohmic electrode 105 is formed on, and makes an ohmic contact with, the p-type semiconductor region 103. The n- and p-type semiconductor regions 102 and 103 are horizontally spaced apart from each other by about 1 μm. Specifically, the n-type semiconductor region 102 is formed by implanting Si ions as dopant ions into the GaAs substrate 101, while the p-type semiconductor region 103 is formed by implanting Zn ions as dopant ions into the GaAs substrate 101. The n-side ohmic electrode 104 is formed on the n-type semiconductor region 102 by evaporating and depositing AuGe, for example, thereon. On the other hand, the p-side ohmic electrode 105 is formed on the p-type semiconductor region 103 by evaporating and depositing a stack of Ti, Pt and Au, for example, thereon.

In the horizontal PIN diode shown in FIG. 8, the amount of current flowing rises steeply enough when the diode is turned ON. In addition, the diode has an extremely low resistance, thus attaining a very low loss. It is already known that particularly when the amount of current flowing is raised by increasing the width of the diode, the loss can be reduced considerably.

In the known horizontal PIN diode, however, the n- and p-side ohmic electrodes 104 and 105 face each other. Thus, an inter-electrode capacitance exists between the n- and p-side ohmic electrodes 104 and 105 to decrease the isolation. If the spacing between the n- and p-type semiconductor regions 102 and 103 is about 1 μm, then the spacing between these ohmic electrodes 104 and 105 is usually as narrow as around 4 μm due to various constraints involved with process conditions. Such a narrow gap is one of the main factors of the unwanted increase in capacitance. Moreover, as the diode is widened to increase the amount of current flowing and thereby minimize the loss, the inter-electrode capacitance increases correspondingly. Accordingly, under the current circumstances, it is difficult to cut down the loss drastically and increase the isolation sufficiently at a time.

SUMMARY OF THE INVENTION

It is therefore an object of the present invention to provide a diode with an increased isolation.

An inventive diode includes: a cathode electrode and an anode electrode that are disposed on a semiconductor substrate and are spaced apart from each other; and a shielding metal member placed between the cathode and anode electrodes.

In one embodiment of the present invention, the diode further includes n- and p-type semiconductor regions that are defined in the semiconductor substrate. The cathode electrode is an n-side ohmic electrode formed on the n-type semiconductor region, while the anode electrode is a p-side ohmic electrode formed on the p-type semiconductor region. And the shielding metal member is placed between the n- and p-side ohmic electrodes.

In another embodiment of the present invention, the diode further includes an n-type semiconductor region and an n-type heavily doped semiconductor region that are defined in the semiconductor substrate. The cathode electrode is a Schottky electrode formed on the n-type semiconductor region, while the anode electrode is an n-side ohmic electrode formed on the n-type heavily doped semiconductor region. And the shielding metal member is placed between the Schottky electrode and the n-side ohmic electrode.

In still another embodiment, the diode may further include an insulating film that is formed between the shielding metal member and the semiconductor substrate.

In yet another embodiment, the top of the shielding metal member is preferably higher than the tops of the cathode or anode electrode.

In yet another embodiment, the shielding metal member may be a metal wall with first and second sides, which face a side of the cathode electrode and a side of the anode electrode, respectively. The first side of the metal wall may be greater in area than the side of the cathode electrode.

In an alternative embodiment, the shielding metal member may also be a metal wall with first and second sides, which face a side of the cathode electrode and a side of the anode electrode, respectively. The second side of the metal wall may be greater in area than the side of the anode electrode.

An inventive method for fabricating a diode includes the steps of: a) defining p- and n-type semiconductor regions in a semiconductor substrate; b) forming a p-side ohmic electrode on the p-type semiconductor region; c) forming an n-side ohmic electrode on the n-type semiconductor region; d) forming an insulating film on a region of the semiconductor substrate, the region being located between the p- and n-type semiconductor regions; and e) forming a shielding metal member on the insulating film.

In one embodiment of the present invention, the step a) may include the sub-steps of: preparing a semiconductor substrate (e.g., semi-insulating semiconductor substrate) with a high resistivity; defining p- and n-type doped regions in the semiconductor substrate; and activating dopants in the p- and n-type doped regions.

In another embodiment of the present invention, the step b) or c) and the step e) may be performed at a time by using the same material for the p- or n-side ohmic electrode and the shielding metal member.

An inventive coplanar waveguide includes a diode including a cathode electrode, an anode electrode and a shielding metal member. The cathode and anode electrodes are disposed on a semiconductor substrate and spaced apart from each other. The shielding metal member is placed between the cathode and anode electrodes. The coplanar waveguide further includes: a first signal line connected to the cathode electrode of the diode; a second signal line connected to the anode electrode of the diode; and a grounded conductor placed in the vicinity of the first and second signal lines and connected to the shielding metal member.

In one embodiment of the present invention, the shielding metal member and the grounded conductor may be integrated together.

DESCRIPTION OF THE PREFERRED EMBODIMENTS

The diode of the present invention includes a shielding metal member (e.g., a metal wall) placed between cathode and anode electrodes that are spaced apart from each other. The shielding metal member can block the electric field existing between these electrodes. Accordingly, the inter-electrode capacitance can be reduced and yet the isolation can be increased. Hereinafter, preferred embodiments of the present invention will be described with reference to the accompanying drawings. It should be noted that the present invention is in no way limited to the following illustrative embodiments.

Embodiment 1

Figure 1:
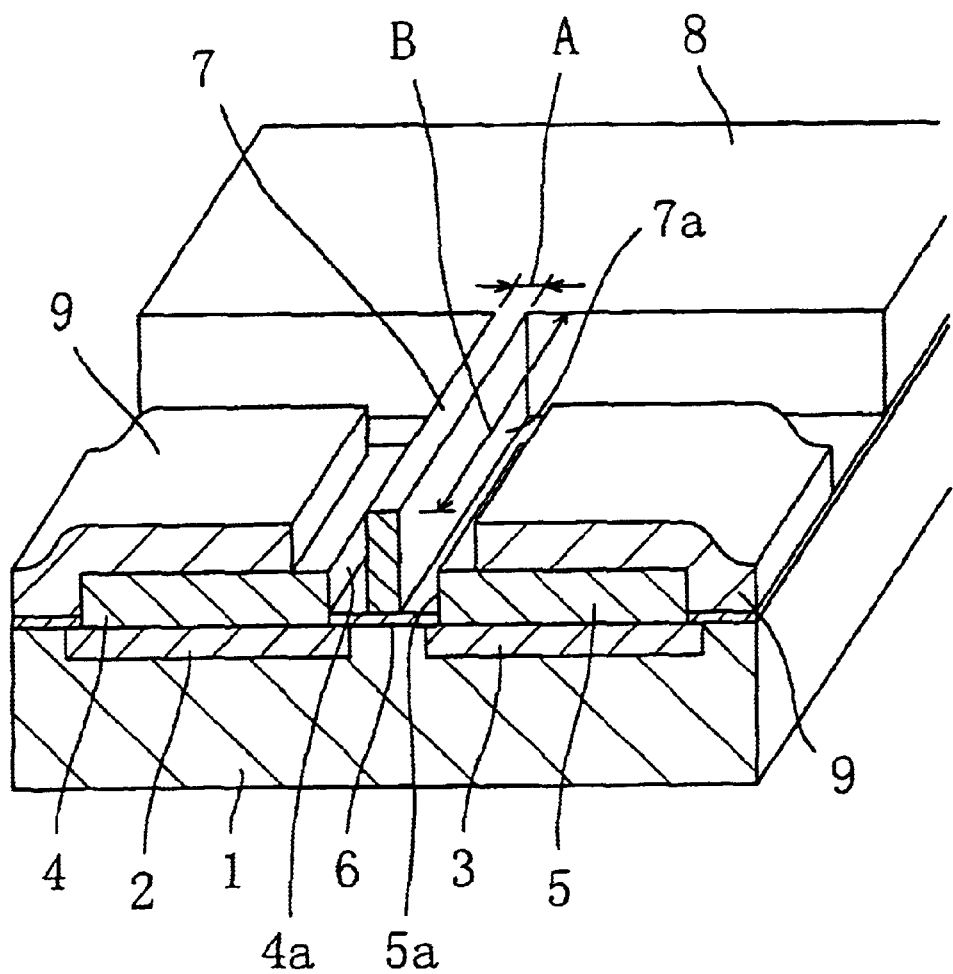
FIG. 1 is a perspective view schematically illustrating a PIN diode according to a first embodiment of the present invention.

FIG. 1 schematically illustrates a diode according to a first embodiment of the present invention. As shown in FIG. 1, the diode is implemented as a horizontal PIN diode. The diode includes: n- and p-type semiconductor regions 2 and 3 defined in a semiconductor substrate 1; and n- and p-side ohmic electrodes 4 and 5 (which are exemplary cathode and anode electrodes) formed on the n- and p-type semiconductor regions 2 and 3, respectively. The diode further includes a shielding metal member 7 (e.g., shielding metal wall in the illustrated embodiment) placed between the n- and p-side ohmic electrodes 4 and 5.

The semiconductor substrate 1 may be a GaAs substrate, i.e., a semi-insulating semiconductor substrate made of GaAs with a high resistivity. The n- and p-type semiconductor regions 2 and 3 are defined in respective surface regions of the semiconductor substrate 1 and horizontally spaced apart from each other by about 1 μm. Specifically, the n-type semiconductor region 2 is formed by implanting Si ions as dopant ions into a surface region of the semiconductor substrate 1, while the p-type semiconductor region 3 is formed by implanting Zn ions as dopant ions into another surface region of the substrate 1. The n-side ohmic electrode 4 (thickness: 0.6 μm) makes an ohmic contact with the n-type semiconductor region 2, while the p-side ohmic electrode 5 (thickness: 0.6 μm) makes an ohmic contact with the p-type semiconductor region 3. And the n- and p-side ohmic electrodes 4 and 5 are horizontally spaced apart from each other by about 5 μm.

The n-side ohmic electrode 4 is formed on the n-type semiconductor region 2 by evaporating and depositing AuGe, for example, thereon. On the other hand, the p-side ohmic electrode 5 is formed on the p-type semiconductor region 3 by evaporating and depositing a stack of Ti, Pt and Au, for example, thereon. In the illustrated embodiment, the widths (i.e., the sizes as measured along the arrow B shown in FIG. 1) of the n- and p-type semiconductor regions 2 and 3 and the n- and p-side ohmic electrodes 4 and 5, which will define the width of the resultant diode, may be 50 μm and 50 μm, respectively.

The shielding metal member 7 is placed between the n- and p-side ohmic electrodes 4 and 5 to reduce an inter-electrode capacitance between these ohmic electrodes 4 and 5. In the illustrated embodiment, the shielding metal member 7 is shaped as a metal wall that has been formed by evaporating and depositing a stack of Ti, Pt and Au, for example. It should be noted that the shielding metal member 7 has only to function as an electromagnetic shield contributing to reduction in inter-electrode capacitance. Thus, the shielding metal member 7 does not have to be formed in the wall shape, but may have any other arbitrary shape.

To block the electric field existing between the n- and p-side ohmic electrodes 4 and 5 with more certainty, the top of the metal wall 7 is preferably higher than that of the electrode 4 or 5. Also, a side 7a of the metal wall 7 is preferably greater in area than side faces (or end faces) 4a and 5a of these electrodes 4 and 5 that are placed to face each other. In other words, if the side 7a of the metal wall 7 is greater in area than the side 4a or 5a of the electrode 4 or 5, then the electric field between these electrodes 4 and 5 can be blocked with much more certainty. As a result, the isolation of the diode can be increased effectively. In the illustrated embodiment, the metal wall 7 may have a height of 2.8 μm, a length (the size A indicated in FIG. 1) of 1 μm and a width (a size as measured along the arrow B shown in FIG. 1) of 120 μm, for example. In the illustrated embodiment, the height of the metal wall 7 (e.g., 2.8 μm) is greater than that of the electrode 4 or 5 (e.g., about 0.6 μm). However, we confirmed based on the results of experiments that the electric field between the electrodes 4 and 5 can be blocked sufficiently even if the height of the metal wall 7 is approximately equal to the height (i.e., thickness) of the electrode 4 or 5. Accordingly, the metal wall 7 may be almost as high as the electrode 4 or 5.

A direct contact of the metal wall 7 with the semiconductor substrate 1 will interfere with the normal operation of the PIN diode. For that reason, an insulating film 6 is provided between the metal wall 7 and the semiconductor substrate 1. In the illustrated embodiment, an oxide film 6 (e.g., SiO$_2$ film) with a thickness (e.g., about 0.1 μm) much smaller than that of the n- or p-side ohmic electrode 4 or 5 is formed between the metal wall 7 and the semiconductor substrate 1. In an alternative embodiment, the direct contact between the metal wall 7 and the semiconductor substrate 1 is also avoidable by forming a shielding metal member in an elevated, air-bridge shape without providing the oxide film 6 between the member and the substrate 1.

The metal wall 7 is connected to a grounded metal structure (i.e., a grounded plane) 8, for example, so that the metal wall 7 is at a ground potential. In the illustrated embodiment, where a transmission line for supplying RF power is implemented as a coplanar waveguide, the grounded metal structure 8 and the metal wall 7 are integrated together. And the metal wall 7, mechanically connected to the grounded metal structure 8, is positioned between the n- and p-side ohmic electrodes 4 and 5. A line 9 is connected to each of the n- and p-side ohmic electrodes 4 and 5. One end of the line 9, which is located closer to the metal wall 7, is set 10 $\mu$m back from the nearest end of the n- or p-side electrode 4 or 5. In other words, the end of the line 9 is farther away from the metal wall 7 by 10 $\mu$m than the end of the n- or p-side ohmic electrode 4 or 5 is. The thickness of the line 9 may be 2.2 $\mu$m, for example. Also, in the illustrated embodiment, the top of the metal wall 7 is set higher than the top of the line 9.

In the PIN diode of the first embodiment, the shielding metal member (e.g., metal wall) 7 is provided between the n- and p-side ohmic electrodes 4 and 5, which are spaced apart from each other, to block the electric field existing between these electrodes 4 and 5. Thus, compared to the prior art, the diode can have its inter-electrode capacitance reduced and its isolation increased.

The present inventors measured the isolations of the inventive and known PIN diodes. As a result, the inventive PIN diode had an isolation of −19 dB, while the known PIN diode not including the metal wall 7 had an isolation of −13 dB. Thus, according to the present invention, the isolation could be increased by 6 dB. Based on these results, we confirmed that the inventive PIN diode has much improved isolation characteristics compared to the known PIN diode with no metal wall 7. As used herein, the "isolation" is determined by the following scattering parameter $S_{21}$:

$$S_{21} = \frac{b_2}{a_1}\bigg|_{a_2=0}$$

where $b_2$ is reflected power of Port 2 (i.e., the n-side ohmic electrode 4 in this case), $a_1$ is incident power of Port 1 (i.e., the p-side ohmic electrode 5 in this case) and $a_2$ is incident power of Port 2. This means that S21 is a transmission coefficient under the condition that $a_2=0$.

In the foregoing embodiment, the metal wall 7 is grounded using the grounded metal structure 8 of a coplanar waveguide. However, the coplanar waveguide does not have to be used and the potential of the metal wall 7 may be set to an arbitrary constant potential. Also, in the foregoing embodiment, the metal wall 7 and the grounded metal structure 8 are integrated together. Alternatively, the metal wall 7 and the grounded metal structure 8 may be formed separately from each other and then connected together.

Hereinafter, a method for fabricating the PIN diode of this embodiment will be described with reference to FIGS. 2A, 2B, 2C, 3A, 3B, 3C, 4A and 4B. FIGS. 2A through 4B are cross-sectional views illustrating respective process steps for fabricating the PIN diode of the first embodiment.

Figure 2A:
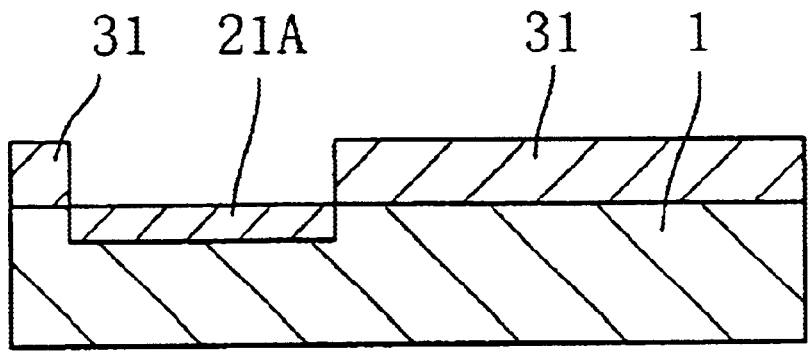
FIGS. 2A, 2B, 2C, 3A, 3B, 3C, 4A and 4B are cross-sectional views illustrating respective process steps for fabricating the PIN diode of the first embodiment.

First, after a semiconductor substrate 1 of GaAs has been prepared, a first resist pattern 31 with an opening for forming an n-type semiconductor region is defined on the semiconductor substrate 1 as shown in FIG. 2A. Next, Si ions are implanted as n-type dopant ions into a surface region of the semiconductor substrate 1 using the first resist pattern 31 as a mask, thereby forming an n-type doped region 21A. Then, the resist pattern 31 is stripped.

Figure 2B:
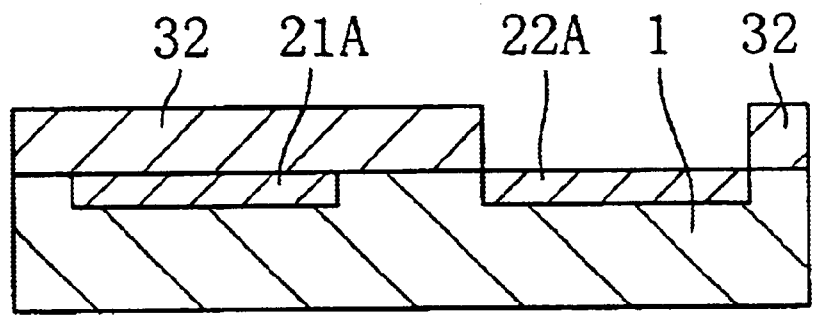

Next, as shown in FIG. 2B, a second resist pattern 32 with an opening for forming a p-type semiconductor region is defined on the semiconductor substrate 1. Subsequently, Zn ions are implanted as p-type dopant ions into another surface region of the semiconductor substrate 1 using the second resist pattern 32 as a mask, thereby forming a p-type doped region 22A. In this process step, the n- and p-type doped regions 21A and 22A are spaced apart from each other by 1 $\mu$m. Thereafter, the resist pattern 32 is stripped.

Figure 2C:
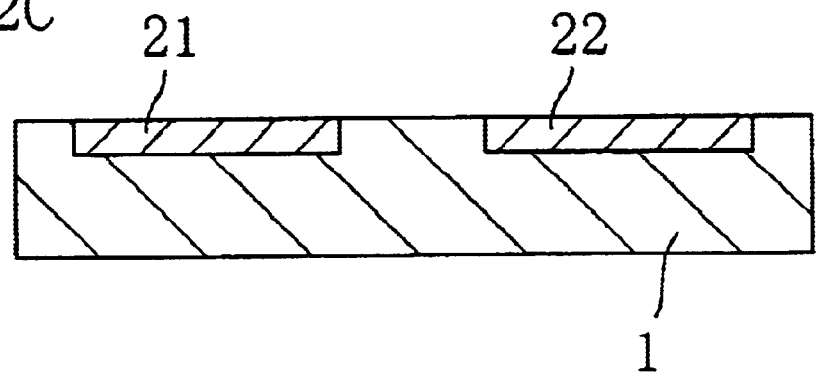

Then, the substrate is annealed to activate the dopants in these doped regions 21A and 22A, thereby forming n- and p-type semiconductor regions 21 and 22 as shown in FIG. 2C.

Figure 3A:
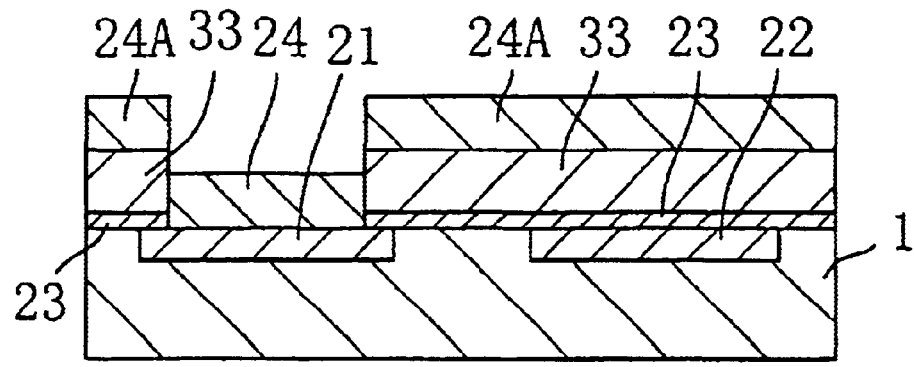

Subsequently, as shown in FIG. 3A, an insulating film 23 of SiO$_2$ is deposited to a thickness of 0.1 $\mu$m over the semiconductor substrate 1 and then a third resist pattern 33, which will define a pattern for an n-side ohmic electrode 24, is formed on the insulating film 23. Then, the insulating film 23 is partially etched away to define an opening for the n-side ohmic electrode 24 using the third resist pattern 33 as a mask. Next, a metal film 24A of AuGe, for example, is deposited to a thickness of 0.6 $\mu$m over the substrate, as well as inside the opening, using the third resist pattern 33 as a mask. Thereafter, the third resist pattern 33 is lifted off and the substrate is heat-treated, thereby forming the n-side ohmic electrode 24.

Figure 3B:
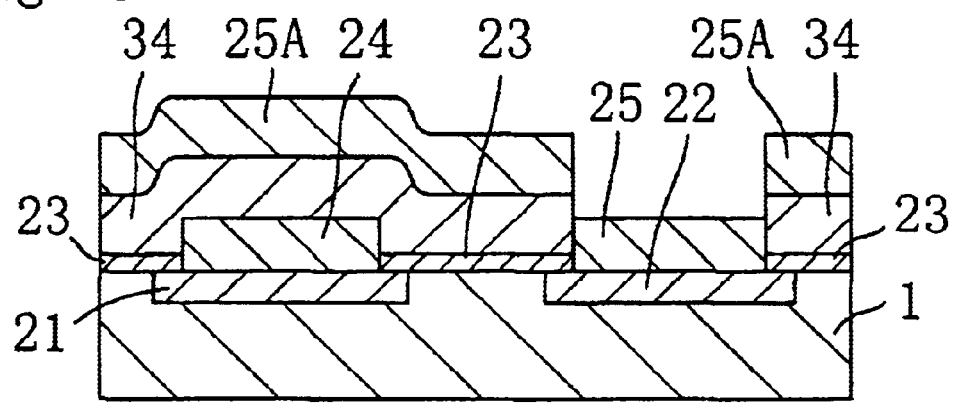

Then, as shown in FIG. 3B, a fourth resist pattern 34, which will define a pattern for a p-side ohmic electrode 25, is formed on the semiconductor substrate 1. Next, the insulating film 23 is partially etched away to define an opening for the p-side ohmic electrode 25 using the fourth resist pattern 34 as a mask. Next, a metal film 25A is deposited as a stack of Ti, Pt, Au and Ti, for example, to a thickness of 0.6 $\mu$m over the substrate, as well as inside the opening, using the fourth resist pattern 34 as a mask. Thereafter, the fourth resist pattern 34 is lifted off, thereby forming the p-side ohmic electrode 25.

Figure 3C:
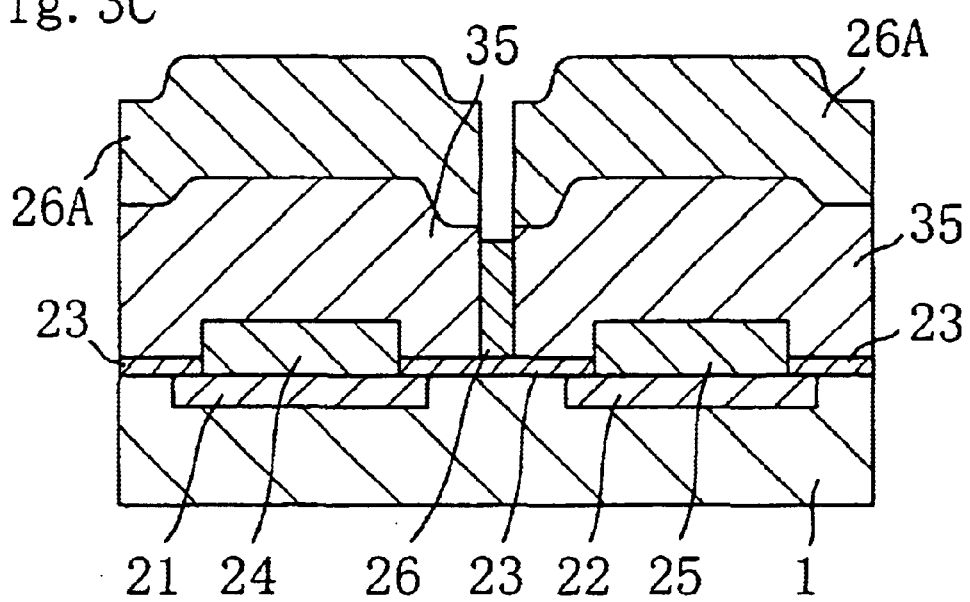

Next, as shown in FIG. 3C, a fifth resist pattern 35, which has an opening defining a pattern for a metal wall 26, is formed on the semiconductor substrate 1. Next, a metal film 26A is deposited to a thickness of 2.6 $\mu$m over the substrate, as well as inside the opening, using the fifth resist pattern 35 as a mask. Thereafter, the fifth resist pattern 35 is lifted off, thereby forming the metal wall 26.

Figure 4A:
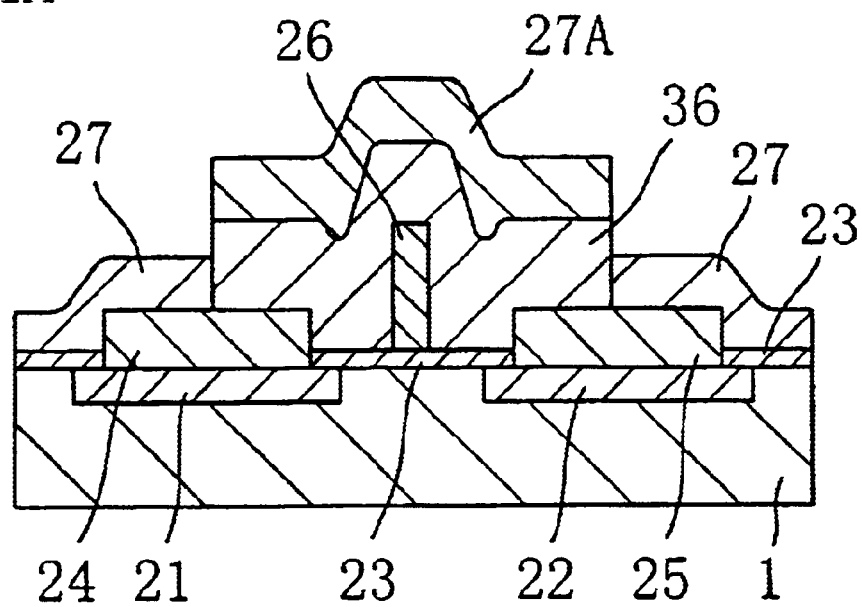
Figure 4B:
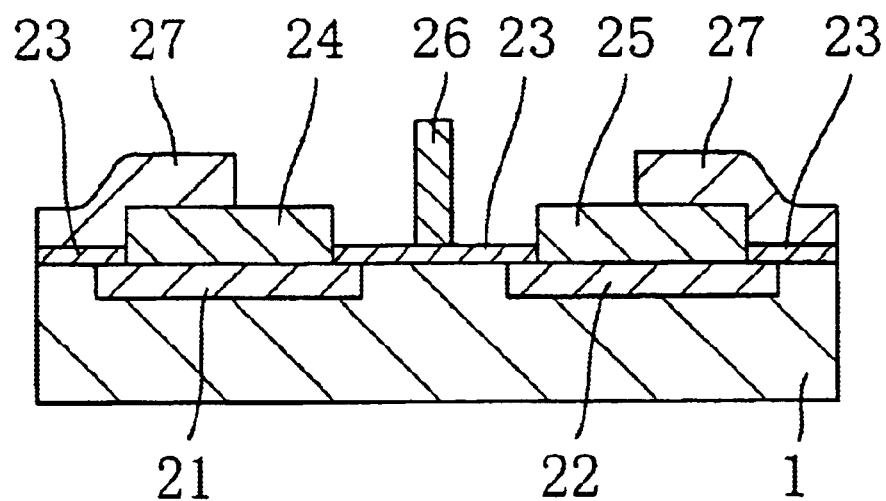

Subsequently, as shown in FIG. 4A, a sixth resist pattern 36, which will define a pattern for lines 27, is formed on the semiconductor substrate 1. Next, the surface of the substrate is plated with a metal film 27A to a thickness of 2.0 $\mu$m using the sixth resist pattern 36 as a mask. Thereafter, the sixth resist pattern 36 is lifted off, thereby forming the lines 27. In this manner, a PIN diode with the metal wall 26 provided between the n- and p-side ohmic electrodes 24 and 25 is obtained as shown in FIG. 4B.

According to the fabrication process of the first embodiment, a low-loss PIN diode including the metal wall 26, which can increase the isolation, can be fabricated easily and just as intended.

It should be noted that if the p-side ohmic electrode 25 and the metal wall 26 are formed out of the same material in the same process step, then the number of process steps can be reduced. Alternatively, the n-side ohmic electrode 24 and the metal wall 26 may be formed out of the same material in the same process step. Furthermore, the height of the metal wall 26 may be approximately equal to the height (i.e., thickness) of the ohmic electrode 24 or 25 (e.g., about 0.6 µm). In that case, the metal wall 26 and ohmic electrode 24 and 25 can be formed more easily in the same process step. We also confirmed based on the results of experiments that even the metal wall 26 with such a height can block the electric field between the ohmic electrodes 24 and 25 sufficiently.

Figure 5:
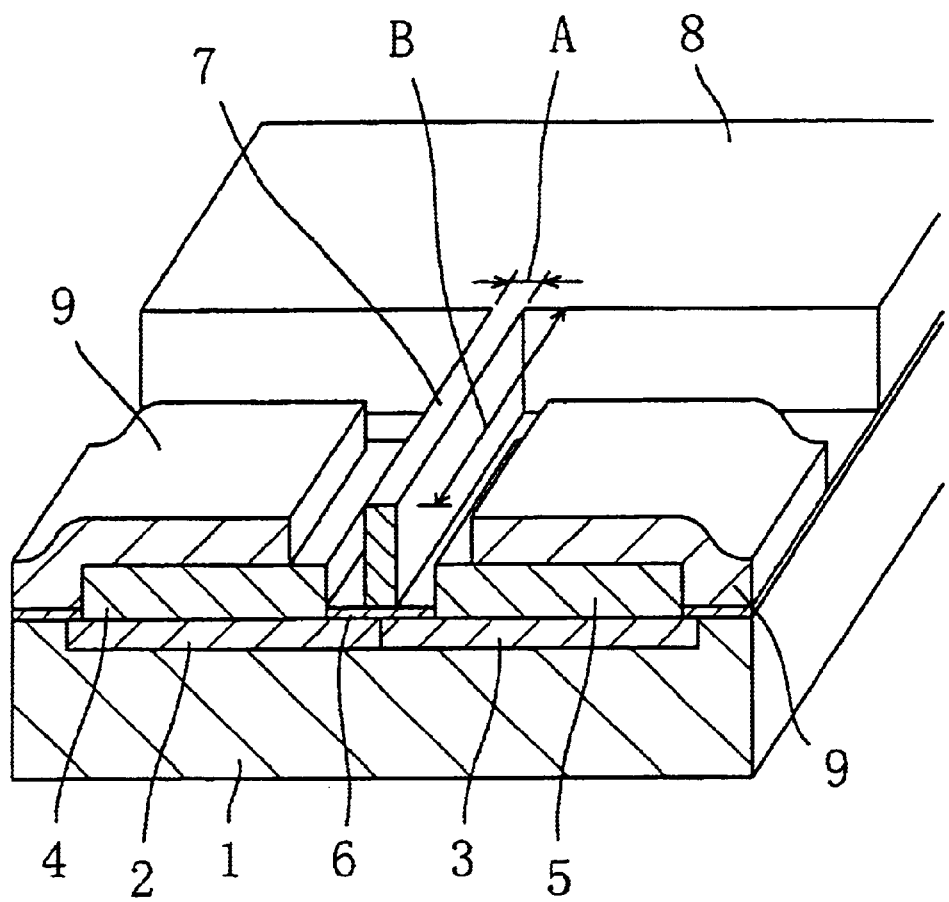
FIG. 5 is a perspective view schematically illustrating a PN diode according to the first embodiment.

In the foregoing embodiment, the present invention has been described as being applied to a PIN diode. However, the present invention is also applicable to a PN diode of the type shown in FIG. 5, in which the n- and p-type semiconductor regions 2 and 3 are not separated but are in contact with each other. As another alternative, the present invention is further applicable to various diodes other than PIN and PN diodes. Examples of the implementable diodes include Schottky diodes, MIS diodes and heterojunction diodes.

Figure 6:
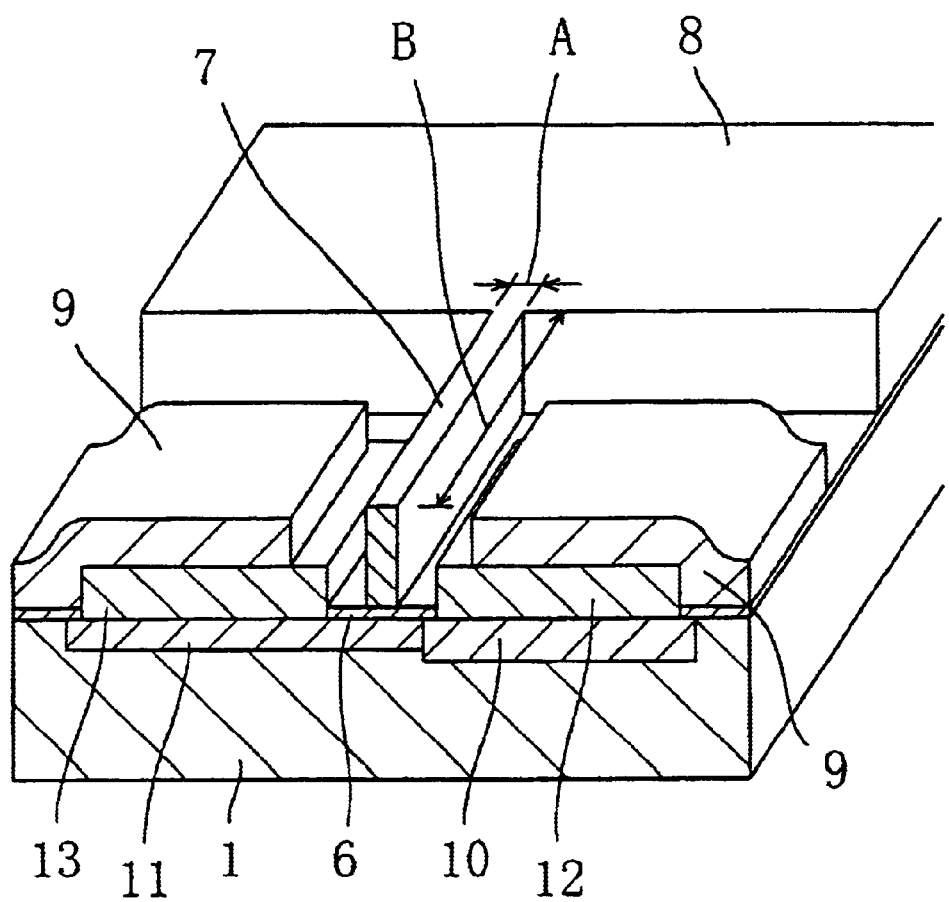
FIG. 6 is a perspective view schematically illustrating a Schottky diode according to the first embodiment.

FIG. 6 schematically illustrates an alternative to the first embodiment in which the present invention is implemented as a Schottky diode.

As shown in FIG. 6, the Schottky diode includes an $n^+$-type heavily doped semiconductor region 10 and an n-type semiconductor region 11 that are defined in a semiconductor substrate 1. The semiconductor substrate 1 may be made of GaAs with a high resistivity. The $n^+$-type heavily doped semiconductor region 10 and the n-type semiconductor region 11 are both formed by implanting Si ions as dopant ions into respective surface regions of the semiconductor substrate 1. The dopant concentration in the n-type semiconductor region 11 is lower than that in the $n^+$-type heavily doped semiconductor region 10. The Schottky diode further includes: an ohmic electrode (i.e., an exemplary anode electrode) 12, which makes an ohmic contact with the $n^+$-type heavily doped semiconductor region 10; and a Schottky electrode (i.e., an exemplary cathode electrode) 13, which makes a Schottky contact with the n-type semiconductor region 11. The ohmic electrode 12 is formed on the n+-type heavily doped semiconductor region 10 by evaporating and depositing AuGe, for example, thereon. The thickness of the ohmic electrode 12 may be 0.6 µm, for example. On the other hand, the Schottky electrode 13 is formed on the n-type semiconductor region 11 by evaporating and depositing a stack of Ti, Pt and Au, for example, thereon. The thickness of the Schottky electrode 13 may also be 0.6 µm, for example. And the ohmic and Schottky electrodes 12 and 13 are horizontally spaced apart from each other by 5 µm.

Also, an oxide film 6 with a thickness (e.g., about 0.1 µm) much smaller than that of the ohmic or Schottky electrode 12 or 13 is formed between the ohmic and Schottky electrodes 12 and 13 on the semiconductor substrate 1. Furthermore, a metal wall 7 is formed on the oxide film 6 by evaporating and depositing a stack of Ti, Pt and Au, for example, thereon. In the illustrated embodiment, the metal wall 7 may have a height of 2.8 µm, a length (the size A indicated in FIG. 6) of 1 µm and a width (a length as measured along the arrow B shown in FIG. 6) of 120 µm, for example. This metal wall 7 is an exemplary shielding metal member provided between the ohmic and Schottky electrodes 12 and 13 to reduce an inter-electrode capacitance between these electrodes 12 and 13. If a transmission line for supplying RF power is implemented as a coplanar waveguide, the metal wall 7 is connected to a grounded metal structure 8 of the coplanar waveguide. In the illustrated embodiment, the grounded metal structure 8 and the metal wall 7 are integrated together. A direct contact of the metal wall 7 with the semiconductor substrate 1 will interfere with the normal operation of the Schottky diode. For that reason, the oxide film 6 is herein provided between the metal wall 7 and the semiconductor substrate 1. In an alternative embodiment, a substitute shielding metal member may be formed in an elevated, air-bridge shape without providing the oxide film 6 between the wall 7 and the substrate 1.

A line 9 is connected to each of the ohmic and Schottky electrodes 12 and 13. The thickness of the line 9 may be 2.2 µm, for example. One end of the line 9, which is located closer to the metal wall 7, is set 10 µm back from the nearest end of the ohmic or Schottky electrode 12 or 13 as shown in FIG. 6. The lines 9 and the grounded metal structure 8 may be formed at a time by a plating technique, for example.

Embodiment 2

Figure 7A:
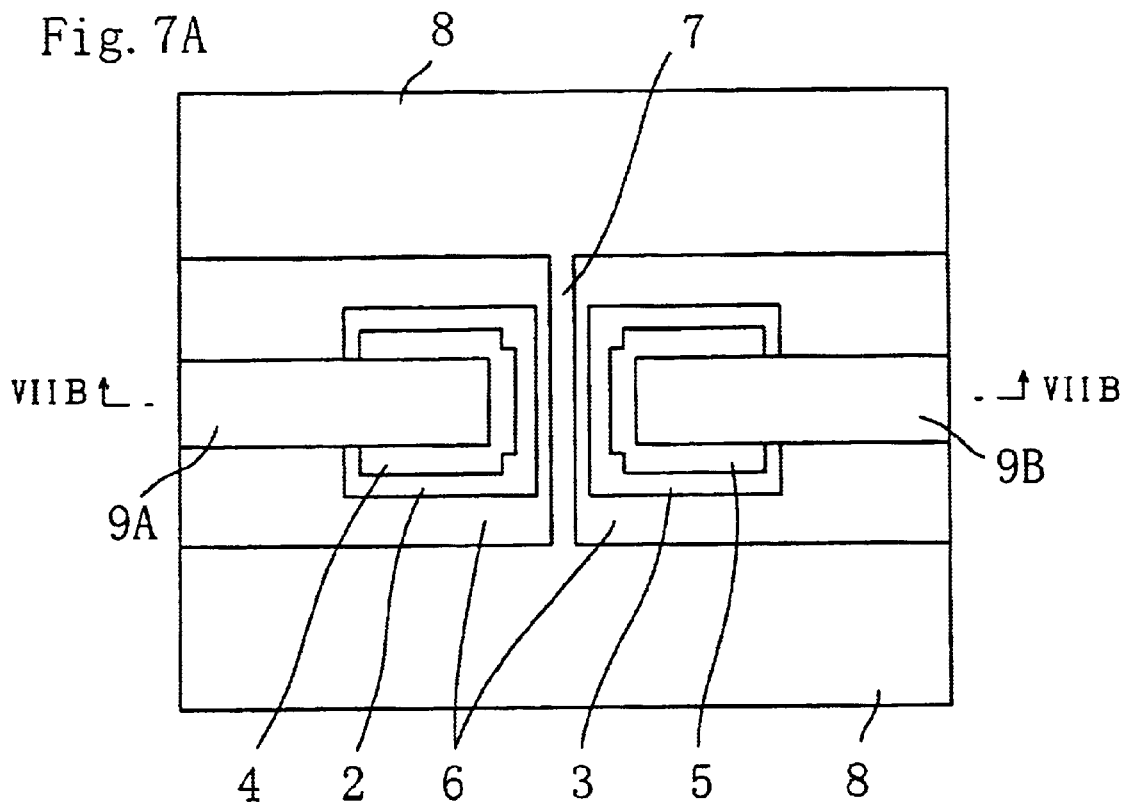
FIG. 7A is a plan view illustrating a coplanar waveguide according to a second embodiment of the present invention.
Figure 7B:
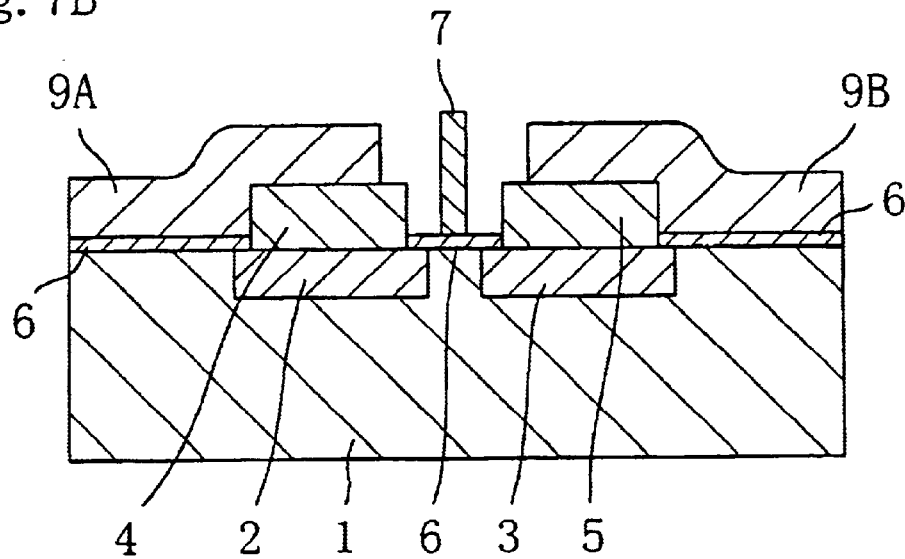
FIG. 7B is a cross-sectional view of the waveguide taken along the line VIIB—VIIB shown in FIG. 7A.
Figure 8:
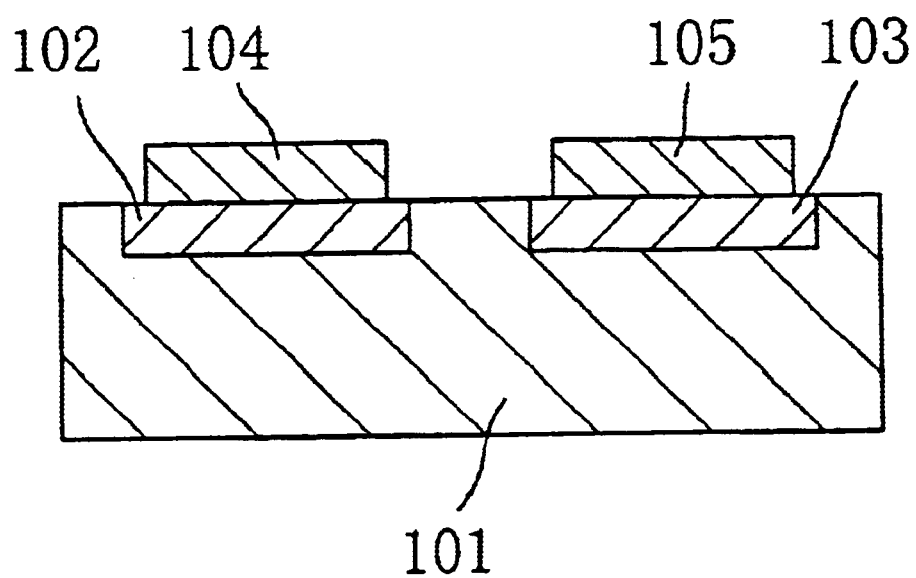
FIG. 8 is a cross-sectional view schematically illustrating a known horizontal PIN diode.

Hereinafter, a coplanar waveguide according to a second embodiment of the present invention will be described with reference to FIGS. 7A and 7B. FIG. 7A is a plan view illustrating a coplanar waveguide, including a horizontal PIN diode, according to the second embodiment. FIG. 7B is a cross-sectional view of the waveguide taken along the line VIIB-VIIB shown in FIG. 7A.

The coplanar waveguide includes: the PIN diode with the metal wall 7 according to the first embodiment; first and second signal lines 9A and 9B; and the grounded metal structure 8. The first signal line 9A is connected to the n-side ohmic electrode (i.e., an exemplary cathode electrode) 4 of the PIN diode, while the second signal line 9B is connected to the p-side ohmic electrode (i.e., an exemplary anode electrode) 5 of the PIN diode. And the grounded metal structure 8 is placed in the vicinity of the first and second signal lines 9A and 9B and mechanically connected to the metal wall 7. In the illustrated embodiment, the metal wall 7 is connected to the grounded metal structure 8 that is placed to sandwich the first and second signal lines 9A and 9B therebetween. However, the metal wall 7 may also be connected to an alternative grounded metal structure 8 that has been formed on only one side (i.e., over or under in FIG. 7A) of these signal lines 9A and 9B. This is because the inter-electrode capacitance can also be reduced and the isolation can also be increased even when such an alternative structure 8 is used.

The PIN diode included in the coplanar waveguide of the second embodiment may have the same construction as the PIN diode of the first embodiment. The PIN diode includes n- and p-type semiconductor regions 2 and 3 that are defined to be spaced apart from each other in a semiconductor substrate 1. The semiconductor substrate 1 may be made of GaAs with a high resistivity. The PIN diode further includes: an n-side ohmic electrode 4 (thickness: 0.6 µm), which makes an ohmic contact with the n-type semiconductor region 2; and a p-side ohmic electrode 5 (thickness: 0.6 µm), which makes an ohmic contact with the p-type semiconductor region 3. The n- and p-side ohmic electrodes 4 and 5 are horizontally spaced apart from each other by 5 µm. And the n- and p-side ohmic electrodes 4 and 5 are connected to the first and second signal lines 9A and 9B, respectively. The thickness of the lines 9A and 9B may be 2.2 µm, for example. As shown in FIGS. 7A and 7B, one end of each of these lines 9A and 9B, which is located closer to the metal wall 7, is set 10 µm back from the nearest end of the n- or p-side ohmic electrode 4 or 5. The lines 9A and 9B and the grounded metal structure 8 together constitute the coplanar waveguide to transmit radio frequency power.

Also, an oxide film 6 with a thickness (e.g., about 0.1 µm) much smaller than that of the n- or p-side ohmic electrode 4 or 5 is formed between the n- and p-side ohmic electrodes 4 and 5 on the semiconductor substrate 1. Furthermore, a metal wall 7 is formed on the oxide film 6 by evaporating and depositing a stack of Ti, Pt and Au, for example, thereon. In the illustrated embodiment, the metal wall 7 may have a height of 2.8 μm, a length (i.e., a size as measured in the longitudinal direction of the lines 9A and 9B) of 1 μm and a width (i.e., a size as measured in the width direction of the lines 9A and 9B) of 120 μm, for example. It should be noted that the width (e.g., 120 μm) of the metal wall 7 as measured in the width direction of the lines 9A and 9B may be approximately equal to the spacing of the ground metal structure 8 (e.g., 120 μm). However, the width of the metal wall 7 (or the spacing of the grounded metal structure 8) is not limited to the exemplified one, but may be set to any other appropriate value during the design of the coplanar waveguide.

This metal wall 7 is an exemplary shielding metal member provided between the n- and p-side ohmic electrodes 4 and 5 to reduce an inter-electrode capacitance between these electrodes 4 and 5. The metal wall 7 is mechanically connected to the grounded metal structure 8 of the coplanar waveguide to transmit RF power. A direct contact of the metal wall 7 with the semiconductor substrate 1 will interfere with the normal operation of the PIN diode. For that reason, the oxide film 6 is herein provided between the metal wall 7 and the semiconductor substrate 1. However, as in the first embodiment, a substitute shielding metal member may be formed in an elevated, air-bridge shape without providing the oxide film 6 between the wall 7 and the substrate 1.

In the coplanar waveguide of the second embodiment, the first and second signal lines 9A and 9B are connected to the n- and p-side ohmic electrodes (i.e., exemplary cathode and anode electrodes) 4 and 5 of the diode, respectively. And the shielding metal member (i.e., the metal wall in this embodiment) 7 of the diode is connected to the grounded metal structure (i.e., exemplary grounded conductor) 8 sandwiching the first and second signal lines 9A and 9B therebetween. Thus, by using the coplanar waveguide of the second embodiment, a PIN diode, exhibiting significantly improved isolation characteristics, is implementable through a simplified layout with the number of parts drastically reduced. In the foregoing embodiment, the present invention has been described as being applied to a PIN diode. However, the present invention is also applicable to various diodes other than PIN diodes. Examples of the implementable diodes include PN diodes, Schottky diodes, MIS diodes and heterojunction diodes.

The inventive diode includes a shielding metal member between cathode and anode electrodes. Thus, the diode can reduce an inter-electrode capacitance and yet improve its isolation characteristics. Also, in the inventive coplanar waveguide including the diode, the shielding metal member, provided between the cathode and anode electrodes of the diode, is mechanically connected to a grounded metal structure sandwiching signal lines of the coplanar waveguide therebetween. Accordingly, the isolation characteristics are improvable through a simplified layout with the number of parts drastically reduced.

What is claimed is:

1. A method for fabricating a diode, comprising the steps of:

a) defining p- and n-type semiconductor regions in a semiconductor substrate;

b) forming a p-side ohmic electrode on the p-type semiconductor region;

c) forming an n-side ohmic electrode on the n-type semiconductor region;

d) forming an insulating film on a region of the semiconductor substrate, the region being located between the p- and n-type semiconductor regions; and e) forming a shielding metal member on the insulating film,
      wherein the height of the shielding metal member is equal to or higher than the height of the p- and n-type ohmic electrodes.

2. The method of claim 1, wherein the step a) comprises the substeps of:

preparing a semiconductor substrate with a high resistivity;

defining p- and n-type doped regions in the semiconductor substrate; and activating dopants in the p- and n-type doped regions.

3. The method of claim 1, wherein the step b) or c) and the step e) are performed at a time by using the same material for the p- or n-side ohmic electrode and the shielding metal member.

* * * * *